United States Patent

Sakuraba et al.

[11] Patent Number: 5,955,686
[45] Date of Patent: Sep. 21, 1999

[54] BRAZING MATERIALS FOR PRODUCING METAL-CERAMICS COMPOSITE SUBSTRATES

[75] Inventors: Masami Sakuraba; Masami Kimura; Junji Nakamura; Takashi Ono, all of Shiojiri, Japan

[73] Assignee: Dowa Mining Co., Ltd., Tokyo, Japan

[21] Appl. No.: 08/850,183

[22] Filed: May 2, 1997

[30] Foreign Application Priority Data

Oct. 30, 1996 [JP] Japan .................................. 8-303854

[51] Int. Cl.⁶ ................................ C22C 5/06; C22C 5/00
[52] U.S. Cl. .............................. 75/235; 75/247; 75/252; 148/431; 420/502; 228/262.61
[58] Field of Search .............................. 75/252, 255, 230, 75/231, 235, 233, 247; 106/1.14; 252/514; 228/262.61; 148/431; 420/502

[56] References Cited

U.S. PATENT DOCUMENTS

| | | | |
|---|---|---|---|
| 3,970,590 | 7/1976 | Hoffman et al. | 252/514 |
| 4,410,285 | 10/1983 | Strasser et al. | 384/278 |
| 4,735,866 | 4/1988 | Moorhead | 428/627 |
| 5,001,019 | 3/1991 | Ito et al. | 428/621 |
| 5,340,012 | 8/1994 | Beeferman et al. | 228/124.5 |

FOREIGN PATENT DOCUMENTS

| | | | |
|---|---|---|---|
| 3-46705 | 2/1991 | Japan | 75/255 |
| 3-46706 | 2/1991 | Japan | 75/255 |

OTHER PUBLICATIONS

Chem Abstract 126:228456, 1997.

*Primary Examiner*—Deborah Yee
*Attorney, Agent, or Firm*—Frishauf, Holtz, Goodman, Langer & Chick, P.C.

[57] ABSTRACT

A brazing material having 0.25–0.9 wt % of titanium oxide added to a basic formula consisting of 60–94.25 wt % Ag, 5–30 wt % Cu and 0.5–4.5 wt % of an active metal is processed to form a paste, which is applied to an AlN substrate and overlaid with a copper plate and heat treated to form a joint between the AlN substrate and the copper plate. A resist is applied to the copper plate to form a circuit pattern, which is etched to form a metallized circuit, thereby producing a metal-ceramics composite substrate capable of operation on high electrical power. The substrate is improved in various characteristics of a power module device over the composite substrates produced by using the conventional brazing materials.

15 Claims, 2 Drawing Sheets

BRAZING MATERIALS FOR PRODUCING METAL-CERAMICS COMPOSITE SUBSTRATES

BACKGROUND OF THE INVENTION

The present invention relates to processes for producing composite substrates by joining metals to ceramics. The invention also relates to brazing materials that can effectively be used in joining metals to ceramics.

Several methods are known in the art of joining metal (Cu) plates to ceramic (aluminum nitride or AlN) substrates and two typical examples are the active metal brazing process described in Unexamined Published Japanese Patent Application (kokai) No. 166165/1985 entitled "A Method of Joining Nitride-Base Ceramics to Metals" and the DBC process in which a copper plate is directly joined to a modified surface of an aluminum nitride substrate (as typically described in Unexamined Published Japanese Patent Application No. 163093/1981).

The active metal brazing process provides a higher strength of joint than the DBC process and the resulting joint has desired characteristics such as high durability to repeated heat cycles. Hence, the active metal brazing process currently finds extensive use in the joining of copper plates to non-oxide-base ceramic substrates, for example, nitride ceramic substrates.

Two brazing materials are commercially used in the practice of the active metal brazing process; one of them is composed of Ag, Cu and an active metal selected from among Ti, Zr and Hf (as described in Unexamined Published Japanese Patent Application No. 166165/1985) and the other is an active metal paste material composed of Ag, Cu and titanium hydride (as described in Unexamined Published Japanese Patent Application No. 101153/1991).

Producing circuit substrates by joining a copper plate to both sides of an aluminum nitride substrate with the aid of these brazing materials has already been commercialized; however, most recent circuit substrates are required to perform on larger electrical power and to meet this requirement, it has been desired to develop circuit substrates that are not only provided with good heat dissipating and electrical insulating properties but which also exhibit higher strength and thermal impact resistance

SUMMARY OF THE INVENTION

An object, therefore, of the invention is to provide brazing material that is suitable for use in the manufacture of power module substrates and which is capable of improving their characteristics than the conventional brazing materials.

Another object of the invention is to provide a process for producing metal-ceramics composite substrates using the brazing material.

The present inventors conducted intensive studies in order to attain the stated objects and found that brazing materials with improved heat cycle resistance could be obtained by adding a specified oxide to the known active metal brazing materials. The present invention has been accomplished on the basis of this finding.

According to a first aspect of the invention, there is provided a process for producing a composite substrate by joining a metal plate to a ceramic substrate, which comprises the steps of:

applying to the ceramic substrate a brazing material of which the solids content comprises 60–94.25% Ag, 5–30% Cu, 0.5–4.5% of an active metal and 0.25–0.9% titanium oxide on a weight basis;

superposing a metal plate on the applied brazing material and heating the assembly to form a joint of the metal plate and the ceramic substrate; and applying an etching resist on the metal plate of the joint to form a circuit pattern and etching the metal plate to form a metallized circuit.

According to a second aspect of the invention, there is provided a process for producing a composite substrate by joining a metal plate to a ceramic substrate, which comprises the steps of:

adding 10–14 parts by weight of a vehicle to 100 parts by weight of a powder of which the solids content comprises 60–94.25% of a Ag powder, 5–30% of a Cu powder, 0.5–4.5% of an active metal powder and 0.25–0.9% of a titanium oxide powder;

blending the respective ingredients to form a brazing material in a paste form;

applying the brazing material to the ceramic substrate;

superposing a metal plate on the applied brazing material and heating the assembly to form a joint of the metal plate and the ceramic substrate; and applying an etching resist on the metal plate of the joint to form a circuit pattern and etching the metal plate to form a metallized circuit.

According to a third aspect of the invention, there is provided a brazing material for use in joining a metal plate to a ceramic substrate, which comprises 60–94.25% Ag, 5–30% Cu. 0.5–4.5% of an active metal and 0.25–0.9% titanium oxide on a weight basis.

According to a fourth aspect of the invention, there is provided a brazing material for use in joining a metal plate to a ceramic substrate, which is in a paste form prepared by blending 10–14 parts by weight of a vehicle with 100 parts by weight of a powder which comprises 60–94.25% of a Ag powder, 5–30% of a Cu powder, 0.5–4.5% of an active metal powder and 0.25–0.9% of a titanium oxide powder on a weight basis.

DETAILED DESCRIPTION OF THE INVENTION

Figure 1:
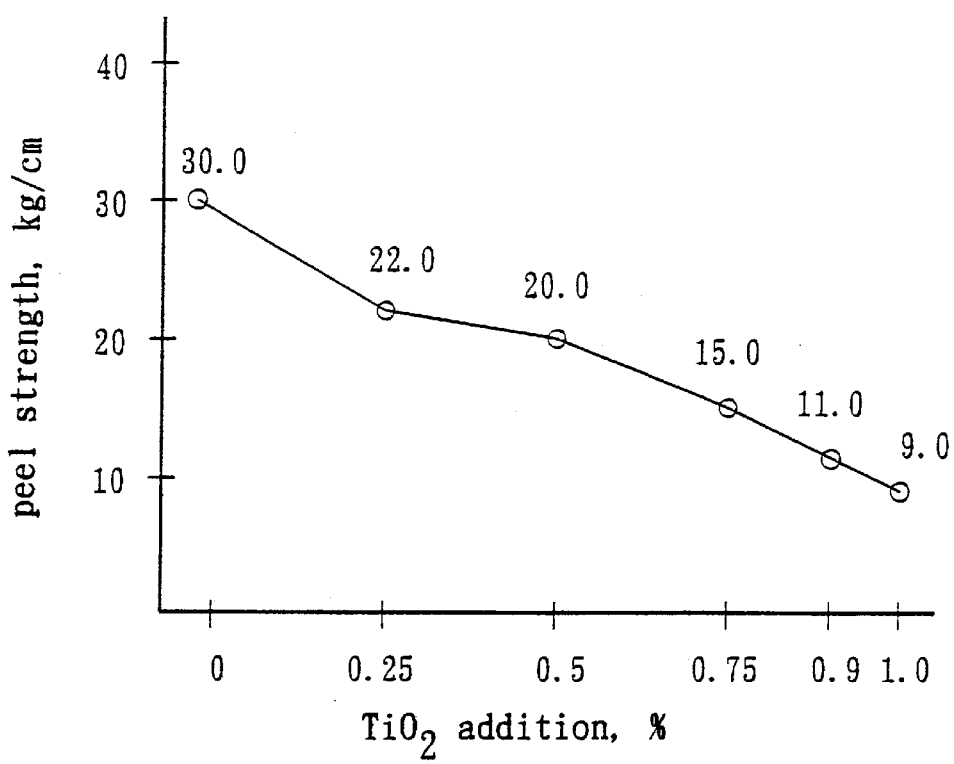
FIG. 1 is a graph showing the peel strength of a metal-ceramics composite substrate as a function of $TiO_2$ addition to a Ag—Cu—Ti based brazing material.

The brazing material to be used in the invention has a Ag content of 60–94.25 wt %. If the Ag content is less than 60 wt % or more than 94.25 wt %, the bonding power of the brazing material will deteriorate. The Cu content of the brazing material ranges from 5 to 30 wt %. If the Cu content is less than 5 wt % or more than 30 wt %, the thermal impact resistance of the brazing material will deteriorate.

The active metal that can be used in the invention is at least one element of group IVa of the periodic table as exemplified by Ti, Zr or Hf. These active metals may be added either in an elemental form or as a hydride and the preferred amount of their addition ranges from 0.5 to 4.5 wt %. Below 0.5 wt %, a nitride layer will form in an insufficient amount to provide the necessary adhesive strength; beyond 4.5 wt %, the adhesive strength is increased but, on the other hand, cracking is prone to occur after joining a metal plate to a ceramic substrate.

Titanium oxide is added as TiO or $TiO_2$ in an amount ranging from 0.25 to 0.9 wt %. These titanium oxides may be amorphous or crystalline.

The present inventors confirmed by experiments that adding these amount of titanium oxide to a brazing material of the composition described above contributes to improvements in various characteristics of the resulting composite substrates such as resistance to repeated heat cycles, flexural strength, deflection and resistance to the passage through a furnace. A probable reason for these contributions would be that the $TiO_2$ or TiO added to the brazing material is dispersed uniformly to reduce the concentration of stresses.

An alloy having the above-defined composition may be directly used as the brazing material of the invention. Alternatively, a powder comprising the particles of the respective ingredients may be mixed with an organic solvent to form a paste of the brazing material. If a metal member is to be simply joined to a ceramic member, the brazing alloy material may be used in the form of a plate of a foil. If an electronic circuit is to be formed on a ceramic substrate, a paste of the brazing material is preferably used.

In order to prepare the paste of brazing material, 55–75 parts by volume of an organic solvent such as terpineol, toluene, methyl cellosolve or ethyl cellosolve may be mixed with 25–45 parts by volume of an organic binder such as PMMA, methyl cellulose or ethyl cellulose to form a vehicle, which is then added in an amount of 10–14 parts by weight to 100 parts by weight of the powder comprising the particles of the respective ingredients for the brazing material.

If less than 10 parts by weight of the vehicle is used, the resulting paste is so viscous that blurred prints will tend to occur. If more than 14 parts by weight of the vehicle is used, the resulting paste is so low in viscosity that print washout will readily occur.

The following examples are provided for the purpose of further illustrating the present invention but are in no way to be taken as limiting.

EXAMPLE 1

An AlN substrate measuring 53×29 mm was provided as a ceramic substrate. A hundred parts by weight of a powder of which the solids content comprised 70.0 wt % of a Ag powder, 27.0 wt % of a Cu powder, 2.5 wt % of a Ti powder and 0.5 wt % of a TiO powder was mixed with 12.4 parts by weight of a vehicle to prepare a paste of brazing material. After applying the paste to both sides of the AlN substrate, two copper plates having thicknesses of 0.3 mm and 0.25 mm were superposed on the respective sides and the assembly was fired in a joining furnace at 830° C. to produce a joint.

The joint was tested for the resistance to repeated heat cycles, flexural strength, deflection and the resistance to a passage through a furnace. The results are shown in Table 1.

COMPARATIVE EXAMPLE 1

An AlN substrate of the same dimensions as described in Example 1 was treated under the same conditions as in Example 1 to produce a joint, except that the paste of brazing material was replaced by a known active metal brazing material in a paste form of which the solids content comprised 70 wt % Ag, 27.5 wt % Cu and 2.5 wt % Ti. The joint was tested for the resistance to repeated heat cycles and other characteristics as evaluated in Example 1. The results are shown in Table 1.

TABLE 1

Comparative Test I
Firing temperature, 830° C.; Cu plate thickness, 0.3/0.25 mm;
Substrate size, 53 × 29 mm

| Class Parameter | Comparative substrate (Ag—Cu—Ti based brazing material) | Invention substrate (Ag—Cu—Ti—$TiO_2$ based brazing material) |
|---|---|---|
| Number of heat cycles to cracking | 30 | 70 |
| Flexural strength | | |
| Initial | 43 kgf/mm² | 44 kgf/mm² |
| After 50 heat cycles | 18 kgf/mm² | 30 kgf/mm² |
| Deflection | | |
| Initial | 0.230 mm | 0.230 mm |
| After 50 heat cycles | 0.085 mm | 0.150 mm |
| Resistance to passage through furnace (370° C. × 10 min) | Microcracks developed upon 2 passes | Microcracks developed upon 5 passes |

As is clear from the data shown in Table 1, the substrate that was composited using the brazing material of the invention was more than twice as resistant to repeated heat cycles as the comparative substrate which was composited using the conventional brazing material. It was also verified that marked improvement were attained in flexural strength and deflection in terms of the value after 50 heat cycles.

EXAMPLE 2

A composite substrate was produced under the same conditions as in Example 1, except that the copper plate thickness was changed to two values of 0.3 mm and 0.15 mm. The substrate was tested for the same characteristics as described in Example 1 and the results are shown in Table 2.

COMPARATIVE EXAMPLE 2

An AlN substrate of the same dimensions as described in Example 2 was treated under the same conditions as in Example 2 to produce a joint, except that the brazing material used was the known type of Ag—Cu—Ti alloy which was employed in Comparative Example 1. The joint was tested for the resistance to repeated heat cycles and other characteristics as evaluated in Example 2; the results are shown in Table 2.

TABLE 2

Comparative Test II
Firing temperature, 830° C.; Cu plate thickness, 0.3/0.15 mm;
Substrate size, 53 × 29 mm

| Class Parameter | Comparative substrate (Ag—Cu—Ti based brazing material) | Invention substrate (Ag—Cu—Ti—$TiO_2$ based brazing material) |
|---|---|---|
| Number of heat cycles to cracking | 50 | 100 |
| Flexural strength | | |
| Initial | 40 kgf/mm² | 40 kgf/mm² |
| After 50 heat cycles | 23 kgf/mm² | 33 kgf/mm² |

TABLE 2-continued

Comparative Test II
Firing temperature, 830° C.; Cu plate thickness, 0.3/0.15 mm;
Substrate size, 53 × 29 mm

| Class Parameter | Comparative substrate (Ag—Cu—Ti based brazing material) | Invention substrate (Ag—Cu—Ti—TiO$_2$ based brazing material) |
| --- | --- | --- |
| Deflection | | |
| Initial | 0.210 mm | 0.210 mm |
| After 50 heat cycles | 0.095 mm | 0.160 mm |
| Resistance to passage through furnace (370° C. × 10 min) | Microcracks developed upon 5 passes | Microcracks developed upon 12 passes |

The data set forth in Table 2 shows that all of the characteristics of the composite substrate produced by using the brazing material of the invention were better than in the case of using the known brazing material of Ag—Cu—Ti base alloy.

EXAMPLE 3

A composite substrate was prepared by joining copper plates to an AlN substrate under the same conditions as shown in Example 1. An etching resist was applied to the surfaces of both Cu plates to form an electronic circuit pattern and the unwanted area of each copper plate were removed with a liquid etchant based on ferric chloride. The etching resist film was then removed to produce an aluminum nitride substrate having copper circuits.

EXAMPLE 4

In order to evaluate the peel strength of a metal-ceramics composite substrate as a function of TiO$_2$ addition to a brazing material, samples of composite substrate were prepared, with the TiO$_2$ addition being varied at 0, 0.25, 0.5, 0.75, 0.9 and 1.0 wt %. The brazing material consisted basically of 70 wt % Ag, 27.5 wt % Cu and 2.5 wt % Ti. The measured values of peel strength are shown in FIG. 1 and those of flexural strength after 50 heat cycles are shown in FIG. 2.

It can be seen from FIG. 1 that the preferred addition of TiO$_2$ is 0.9 wt % and less, in the range of which the peel strength is at least 10 kg/cm.

Figure 2:
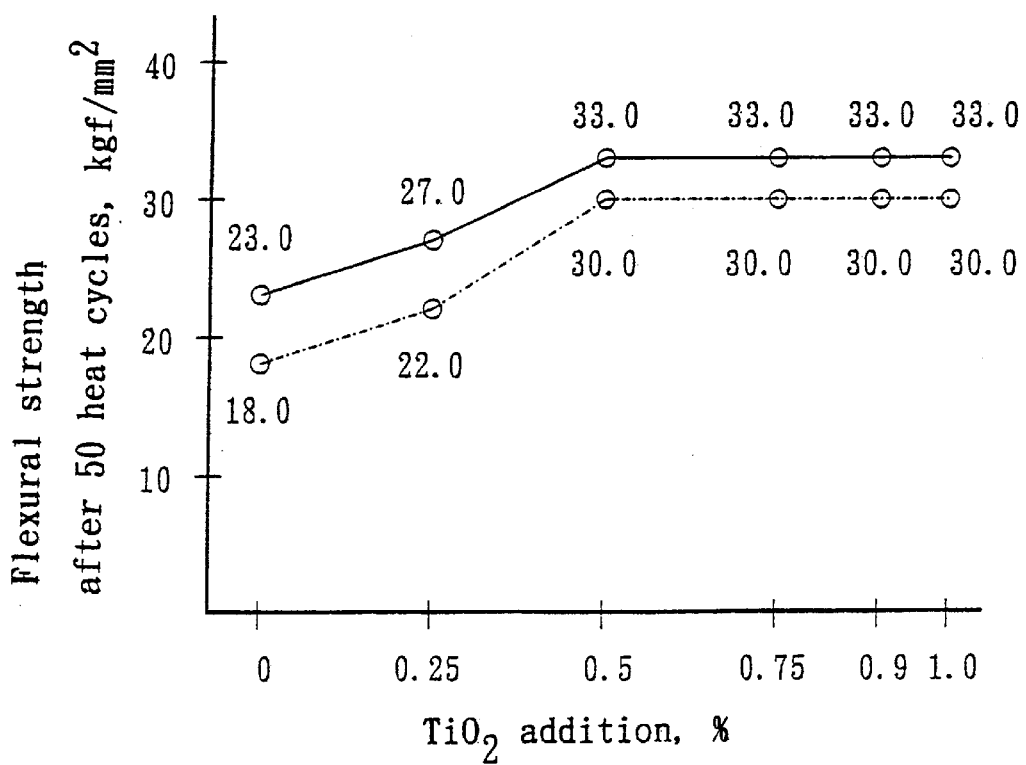
FIG. 2 is a graph showing the flexural strength of a metal-ceramics composite substrate after 50 heat cycles as a function of $TiO_2$ addition to a Ag—Cu—Ti based brazing material.

The data in FIG. 2 shows that with a TiO$_2$ content of 0.25 wt %, the flexural strength after 50 heat cycles was 27 kgf/mm$^2$ with Cu plate thicknesses of 0.3 and 0.15 mm (indicated by a solid line) and 22 kgf/mm$^2$ with thicknesses of 0.3 and 0.25 mm (indicated by a one-long-and-one-short dashed line); it is therefore clear that for practical purposes, the TiO$_2$ addition is preferably at least 0.25 wt %.

Thus, in view of the data shown in FIGS. 1 and 2, the appropriate range of the amount of titanium dioxide is from 0.25 to 0.9 wt %.

EXAMPLE 5

Figure 3:
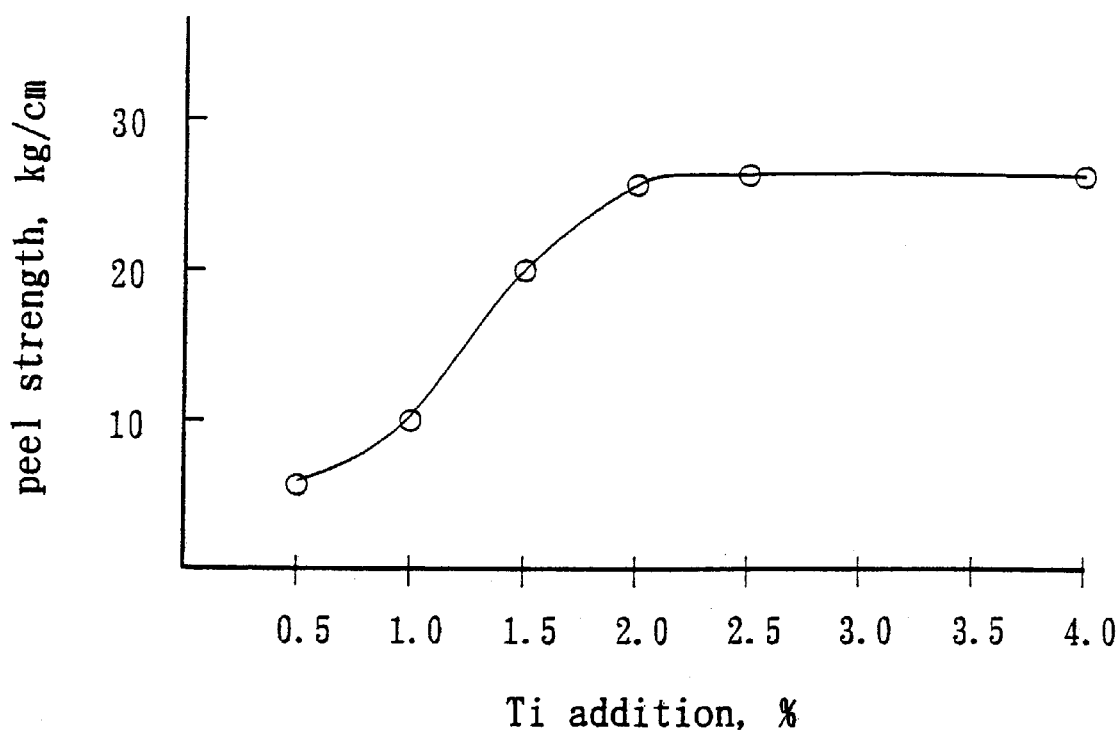
FIG. 3 is a graph showing the heat cycle resistance of a metal-ceramics composite substrate as a function of the Ti content of a Ag—Cu—Ti based brazing material.

In order to evaluate the peel strength of a metal-ceramic composite structure as a function of Ti addition to a Ag—Cu brazing material, samples of composite substrate were prepared, with the addition of a Ti powder as an active metal being varied at 0.5, 1.0, 1.5, 2.0, 2.5, 3.0 and 4.0 wt %. The brazing material consisted of 70 parts by weight of a Ag powder and 27.5 parts by weight of a Cu powder. The measured values of peel strength are shown in FIG. 3, from which one can see that the appropriate range of the addition of a Ti powder is preferably from 0.5 to 4.0 wt %.

EXAMPLE 6

A brazing material made of an alloy consisting of 70.0 wt % Ag and 27.5 wt % Cu was pulverized, mixed with 2.5 wt % of a Ti powder and 0.5 wt % of a TiO$_2$ powder, melted and solidified to prepare a brazing foil made of a quaternary alloy. The foil was applied to both sides of an AlN substrate measuring 53×29 mm and two copper plates having thicknesses of 0.3 mm and 0.25 mm were superposed on the respective sides; the assembly was fired in a joining furnace to produce a joint.

The joint was tested for the resistance to repeated heat cycles, flexural strength, deflection and the resistance to passage through a furnace. The results are shown in Table 3.

EXAMPLE 7

A mixture consisting of 70.0 wt % of Ag powder, 27.5 wt % of Cu powder, 2.5 wt % of Ti powder and 0.5 wt % of TiO$_2$ powder was melted and solidified to prepare a brazing foil made of a quaternary alloy. Using this foil, a joint was produced as in Example 6. The results of evaluation of the characteristics of the joint that are mentioned in Example 6 are shown in Table 3.

As can be seen from the data in Table 3, the brazing foil prepared in Example 6 was somewhat inferior to the pastes of brazing material prepared in Examples 1–5 in terms of flexural strength and deflection; however, its overall characteristics were far better than those of the prior art brazing material.

TABLE 3

Comparative Test III
Firing temperature, 830° C.; Cu plate thickness, 0.3/0.25 mm;
Substarate size, 53 × 29 mm

| Class Parameter | Example 6 | Example 7 |
| --- | --- | --- |
| Number of heat cycles to cracking | 50 | 100 |
| Flexural strength | | |
| Initial | 43 kgf/mm$^2$ | 43 kgf/mm$^2$ |
| After 50 heat cycles | 24 kgf/mm$^2$ | 25 kgf/mm$^2$ |
| Deflection | | |
| Initial | 0.230 mm | 0.230 mm |
| After 50 heat cycles | 0.120 mm | 0.125 mm |
| Resistance to passage through furnace (370° C. × 10 min) | Microcracks developed upon 4 passes | Microcracks developed upon 4 passes |

As described on the foregoing pages, the invention provides a Ag—Cu—Ti—TiO based brazing material that can be produced by adding a suitable amount of titanium oxide to the known Ag—Cu—Ti based brazing material. Metal-ceramics composite substrates produced by using this brazing material are sufficiently improved in heat cycle resistance and other characteristics to be capable of operation on higher electrical power.

What is claimed is:

1. A brazing material for use in joining a metal plate to a ceramic substrate, which comprises 60–94.25% Ag, 5–30%

Cu, 0.5–4.5% of an active metal and 0.25–0.9% titanium oxide on a weight basis.

2. A brazing material for use in joining a metal plate to a ceramic substrate, which is in a paste form prepared by blending 10–14 parts by weight of a vehicle with 100 parts by weight of a powder which comprises 60–94.25% of a Ag powder, 5–30% of a Cu powder, 0.5–4.5% of an active metal powder and 0.25–0.9% of a titanium oxide powder on a weight basis.

3. The brazing material of claim 1, wherein the active metal is at least one element of Group IVa of the Periodic Table selected from the group consisting of Ti, Zr and Hf, said active metal being in elemental form or a hydride thereof.

4. The brazing material of claim 3, wherein the active metal is titanium.

5. The brazing material of claim 1, wherein the active metal is a hydride of an element of Group IVa of the Periodic Table selected from the group consisting of Ti, Zr and Hf.

6. The brazing material of claim 5, wherein the element of Group IVa of the Periodic Table is Ti.

7. The brazing material of claim 1, wherein the titanium oxide is amorphous and is selected from the group consisting of TiO and $TiO_2$.

8. The brazing material of claim 1, wherein the titanium oxide is crystalline and is selected from the group consisting of TiO and $TiO_2$.

9. The brazing material of claim 2, wherein the titanium oxide is amorphous and is selected from the group consisting of TiO and $TiO_2$.

10. The brazing material of claim 2, wherein the titanium oxide is crystalline and is selected from the group consisting of TiO and $TiO_2$.

11. The brazing material of claim 2, wherein the titanium oxide is selected from the group consisting of TiO and $TiO_2$; and the vehicle comprises 55 to 75 parts by volume of an organic solvent and 25 to 45 parts by volume of an organic binder.

12. The brazing material of claim 11, wherein the organic solvent is selected from the group consisting of terpineol, toluene, methyl cellosolve and ethyl cellosolve.

13. The brazing material of claim 12, wherein the organic binder is selected from the group consisting of PMMA, methyl cellulose and ethyl cellulose.

14. The brazing material of claim 1 comprising 70 wt. % Ag, wt. % Cu, 2.5 wt. % Ti as the active metal and 0.5 wt. % TiO as the titanium oxide.

15. The brazing material of claim 1 comprising 70 wt. % Ag, 27.5 wt. % Cu, 2.5 wt. % Ti as the active metal and 0.5 wt. % $TiO_2$ the titanium oxide.

* * * * *